(12) United States Patent
Glembocki et al.

(10) Patent No.: US 9,878,516 B2
(45) Date of Patent: Jan. 30, 2018

(54) METAMATERIAL THIN FILMS

(71) Applicants: Orest J. Glembocki, Alexandria, VA (US); Sharka M Prokes, Columbia, MD (US); Joshua D. Caldwell, Accokeek, MD (US); Mikko Ritala, Espoo (FI); Markku Leskela, Espoo (FI); Jaakko Niinisto, Vantaa (FI); Eero Santala, Klaukkala (FI); Timo Hatanpaa, Espoo (FI); Maarit Kariemi, Helsinki (FI)

(72) Inventors: Orest J. Glembocki, Alexandria, VA (US); Sharka M Prokes, Columbia, MD (US); Joshua D. Caldwell, Accokeek, MD (US); Mikko Ritala, Espoo (FI); Markku Leskela, Espoo (FI); Jaakko Niinisto, Vantaa (FI); Eero Santala, Klaukkala (FI); Timo Hatanpaa, Espoo (FI); Maarit Kariemi, Helsinki (FI)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 437 days.

(21) Appl. No.: 13/784,856

(22) Filed: Mar. 5, 2013

(65) Prior Publication Data

US 2013/0252016 A1  Sep. 26, 2013

Related U.S. Application Data

(60) Provisional application No. 61/606,583, filed on Mar. 5, 2012.

(51) Int. Cl.
*C23C 16/06* (2006.01)
*B32B 3/28* (2006.01)
(Continued)

(52) U.S. Cl.
CPC ........... *B32B 3/28* (2013.01); *B32B 15/04* (2013.01); *C23C 16/06* (2013.01); *C23C 16/18* (2013.01);
(Continued)

(58) Field of Classification Search
CPC ........... B32B 3/28; B32B 15/04; C23C 16/06
(Continued)

(56) References Cited

U.S. PATENT DOCUMENTS

2010/0141358 A1\* 6/2010 Akyurtlu et al. .......... 333/219.1
2012/0273662 A1 11/2012 Caldwell et al.

OTHER PUBLICATIONS

Kariniemi et al., "Plasma-enhanced Atomic Layer Deposition of Silver Thin Films", May 10, 2011, Chemisty of Materials, vol. 23, pp. 2901-2907.*

(Continued)

*Primary Examiner* — Humera N Sheikh
*Assistant Examiner* — Xiaobei Wang
(74) *Attorney, Agent, or Firm* — US Naval Research Laboratory; Rebecca L. Forman

(57) ABSTRACT

A metamaterial thin film with plasmonic properties formed by depositing metallic films by atomic layer deposition onto a substrate to form a naturally occurring mosaic-like nanostructure having two-dimensional features with air gaps between the two-dimensional features. Due to the unique deposition nanostructure, plasmonic thin films of metal or highly conducting materials can be produced on any substrate, including fabrics and biological materials. In addition, these plasmonic materials can be used in conjunction with geometric patterns that may be used to create multiple resonance plasmonic metamaterials.

1 Claim, 8 Drawing Sheets

(51) Int. Cl.
  *B32B 15/04*  (2006.01)
  *C23C 16/50*  (2006.01)
  *C23C 16/18*  (2006.01)
  *C23C 16/455* (2006.01)

(52) U.S. Cl.
  CPC ........ *C23C 16/45542* (2013.01); *C23C 16/50* (2013.01); *Y10T 428/1241* (2015.01); *Y10T 428/24636* (2015.01); *Y10T 428/24736* (2015.01)

(58) Field of Classification Search
  USPC .............................................. 428/615; 1/615
  See application file for complete search history.

(56) References Cited

OTHER PUBLICATIONS

Caldwell et al., "Large-area plasmonic hot-spot arrays", Dec. 7, 2011, Optics Express, vol. 19 No. 27, pp. 26056-26064.*

* cited by examiner

METAMATERIAL THIN FILMS

PRIORITY CLAIM

This Application claims priority from U.S. Provisional Application No. 61/606,583 filed on Mar. 5, 2012 by Orest J. Glembocki et al., entitled "NATURALLY OCCURRING METAMATERIAL THIN FILMS," the entire contents of which are incorporated herein by reference.

BACKGROUND OF THE INVENTION

Field of the Invention

The present invention relates generally to thin films exhibiting metamaterial properties in their as-grown/deposited form, that is films that due to the naturally occurring structure within the film exhibit properties not inherent to the material and, more specifically, to thin film materials deposited or grown by atomic layer deposition or related methods that exhibit plasmonic properties (sub-diffraction limit confinement of light).

Description of the Prior Art

Surface enhanced Raman scattering (SERS) is a technique in which the Raman signal can be enhanced by many orders of magnitude by the use of metal nanoparticles. This enhancement is due to the local electromagnetic fields that are created by the optical excitation of localized surface plasmons. The size, geometry, shape, and alignment of the metallic nanoparticles are important parameters for this enhancement. The metal that exhibits the highest SERS in the visible part of the spectrum is silver, and many SERS enhancement studies have been reported for Ag-based nanoparticles.

Common SERS substrates are based on roughened Ag surfaces produced by etching or chemical deposition, metal coated nanostructures or structures that are lithographically fabricated. The rough substrates work because the roughness is spherical in nature with a Gaussian distribution of sizes. Some disadvantages of these roughened Ag surfaces are that there is no control over plasmonic properties, there is a random nature of roughness, and it cannot be deposited on many substrates including insulators, fabrics, or large areas. Alternative approaches typically suffer from random structures, leading to non-uniform SERS response, or from the high expense associated with lithographic fabrication efforts.

Spoof and hybrid-spoof plasmonics emerge from the properties of metallic conductors with surface geometries defined to mimic the dispersion and confinement of a surface plasmon polariton (SPP) and the confinement of photonic fields in subwavelength regions. In these systems, the operating frequency of the spoof plasmon is defined primarily by the geometry and thus can be used to create designer plasmonic devices. Spoof plasmonics can be achieved with any conductor at frequencies below the plasma frequency. In addition to metals, spoof plasmonics can also be created from highly doped semiconductors or polar dielectrics. A special case of spoof plasmonics is hybrid-spoof plasmonics which uses traditional plasmonic materials such as Ag, Au, Cu, Pt and/or Al within the frequency range at which they can support SPPs along with the fabrication of geometric patterns lithographically defined to induce spoof-plasmon excitations to enable the further control of the SPPs and/or multiple resonant structures. Both spoof and hybrid-spoof plasmon approaches are ideal to create new metamaterials, which have properties normally not found in nature in the near- to mid-IR. The disadvantage of this approach is that lithographic patterns must be formed in order to define the hybrid spoof geometry, and more importantly, if one needs to access hybrid spoof plasmonics in the visible part of the spectrum, the required lithography is too difficult to obtain even by e-beam lithography, due to the small size scales involved (features require spacing on the order of 1-20 nm in separation).

BRIEF SUMMARY OF THE INVENTION

The present invention allows for formation of a plasmonic material in thin film form by depositing metallic films by atomic layer deposition (ALD) or related processes onto a substrate to form a mosaic-like microstructure having two dimensional features with air gaps between the two dimensional features. Due to the ALD process, films with this unique microstructure of these metals or highly conducting materials (e.g. semiconductors) can be produced on any substrate, including fabrics and biological materials. Due to this microstructure, these films naturally exhibit plasmonic resonance response due to a spoof-plasmon process. In addition, these plasmonic materials can be used in conjunction with additional, lithographically defined geometric patterns that may be used to create multiple-resonance plasmonic metamaterials.

With the present invention, a spoof-plasmon film or metamaterial is demonstrated for use in plasmonic and metamaterial concepts and devices. There is no requirement for lithographic fabrication or for additional fabrication steps such as forming Ag nanoparticles (e.g. electrochemical etching) to take advantage of the plasmonic properties. Because these films inherently create gaps between the 2D microstructures on the order of a few nanometers, this naturally occurring structure also allows such spoof-plasmon resonances to be realized within the visible part of the electromagnetic spectrum (hybrid spoof behavior), which would not be realistic using standard lithography tools, where such small spacing between grains would be extremely difficult, if not impossible on large-scale samples. Also, since this process uses ALD, large areas of any substrate can be coated, and the process can be used to create such films on a wide array of substrates including, but not limited to flexible materials and fabrics and those materials with high aspect ratio structures, thus providing a plasmonic response to the substrate without the requirement for additional fabrication steps.

An additional benefit of the present invention is that there is no potential health risk associated with the deployment of these materials in the environment. There is an open concern that inhaling nanomaterials could cause mesothelioma or other serious health conditions. The present invention does not use any loose particles, and thus such concerns do not pertain.

Another advantage of the present invention is the ability to create multi-resonant metamaterials in which the resonances are provided by the as-grown thin film and additional resonances are provided through the lithographic patterning of spoof-plasmon or plasmonic geometric patterns into the as-grown film. This multi-resonance structure can also be attained by having the as-grown metamaterial thin film and an additional spoof-plasmon film created via standard lithographic procedures placed above or below with a thin dielectric spacer layer. In this latter case, coupling between the SPPs in the as-grown metamaterial film and those present in the lithographically defined spoof-plasmon film can be used to create multiple coupled plasmonic resonances. In all of these cases, the as-grown ALD films exhibit a natural resonance and hence can be combined with any other geometric pattern or patterns to create new multi-resonant materials.

Also, because the deposited film already contains natural plasmonic resonances due to the unique nanostructure, the ALD Ag coatings can be placed on any type of material to make it plasmonic without any additional fabrication effort. Hence, substrates such as paper, fabric and plastics that cannot be readily used in plasmonics can be made plasmonic with ALD Ag. This impacts many sensing areas such as colorimetric and SERS-active swabs that can be used for chemical sensing and identification.

These and other features and advantages of the invention, as well as the invention itself, will become better understood by reference to the following detailed description, appended claims, and accompanying drawings.

DETAILED DESCRIPTION OF THE INVENTION

The present invention provides a method of making a metamaterial thin film by depositing any metallic or metallic-like (highly doped semiconductor) material by atomic layer deposition (ALD) onto a substrate that in the as-deposited state forms a mosaic-like surface morphology having two-dimensional features resembling corrugations with nm-scale air gaps between the two-dimensional features, thereby resulting in an as-grown thin film that exhibits plasmonic properties. The films can be deposited using plasma-enhanced atomic layer deposition (PEALD), thermal ALD or other related methods. Unlike ordinary Gaussian roughness, the PEALD-grown films deposited for the reduction to practice for this invention exhibit spoof-like corrugations that are created at the boundaries between neighboring nanostructure grains. The PEALD films contain two-dimensional (2D) nanostructures with a cylindrical grain structure, resulting in a film that is mosaic in nature. The plasmonic fields observed within these films originate from the air gaps located between the islands, and the strength of the enhancement depends on the microstructure of the film, the film thickness, gap width and gap density (2D island size).

The plasmonic material can comprise any metallic or metallic-like material that forms a 2D mosaic thin film structure. Examples include, but are not limited to, Au, Ag, Ru, Pt, Ir, Rh, Pd, Ta, Ti, Cu, Mo, Ni, W, Co, Fe, and combinations thereof.

The substrate can be any non-liquid or non-gas substances including, but not limited to substrates that are both man-made and naturally occurring, such as metals, semiconductors, insulators, ceramics, fabrics, papers, swabs, cloth, plastics, etc. The substrate could also be any man-made structured materials, including nanostructures or materials and patterned substrates of any composition. These substrates can be a flat surface or have a 3D architectures, such as porous media.

Figure 1A:
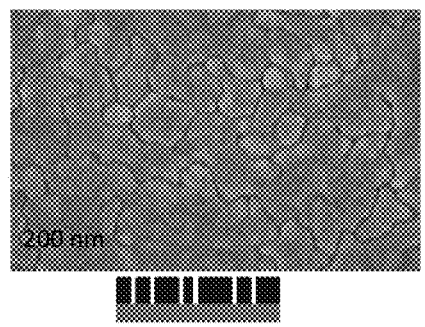
FIG. 1a shows an SEM picture of the naturally occurring ALD Ag nanostructure.
Figure 1B:
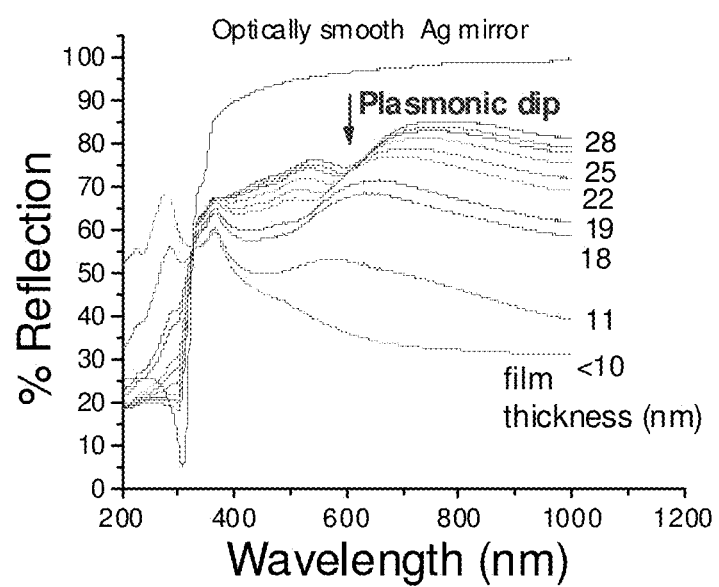
FIG. 1b shows the reflectance spectra of an optically smooth Ag film deposited via electron beam evaporation with the reflectance spectra of ALD Ag films with varying thicknesses, in the case of the latter, the reflectance spectra exhibit a noticeable plasmonic resonance dip that is not observed in the former case. Both types of films were deposited on silicon substrates for direct comparison.

One embodiment of the present invention describes a new form of thin film (<200 nm) Ag exhibiting both plasmonic and metamaterial properties in the as-deposited state. In this embodiment, plasmonic Ag thin films are deposited by plasma enhanced atomic layer deposition (PEALD), using Ag(fod)(PEt$_3$) (fod=2,2-dimethyl-6,6,7,7,8,8,8-hepafluo-rooctade-3,5-dionato) and hydrogen plasma as the precursors. The growth is performed at substrate temperatures between 100 and 130° C. and the temperature of the precursor is between 105 and 120° C., with plasma power between 50 and 150 W. The Ag films deposited by PEALD are highly conducting and consist of textured material. The PEALD Ag films have a unique property in that the grains do not completely coalesce, resulting in a mosaic-like surface morphology, as shown in the SEM image presented in FIG. 1a. These Ag films have a significant number of open and closed two-dimensional features that resemble corrugations or islands. The features are separated by parallel air gap of less than 4 nm, while the surfaces between these air gaps are smooth on a scale much smaller than the resonant wavelengths (<3 nm rms). A schematic of the cross-sectional structure is presented below the SEM image in FIG. 1a. The reflectivity of several of these samples as a function of film thickness is shown in FIG. 1b and is compared to an optically smooth Ag film of 50 nm thickness on silicon deposited by electron-beam evaporation. In all cases, the PEALD Ag films exhibit a dip in the reflectance spectra that red-shifts with increasing Ag PEALD thickness. These dips resemble the surface plasmon resonances associated with Ag nanoparticles or spoof-plasmon structures, such as extraordinary transmission gratings, and the red-shift in the position of this dip with increasing film thickness is consistent with the model describing spoof plasmonics.

Figure 1C:
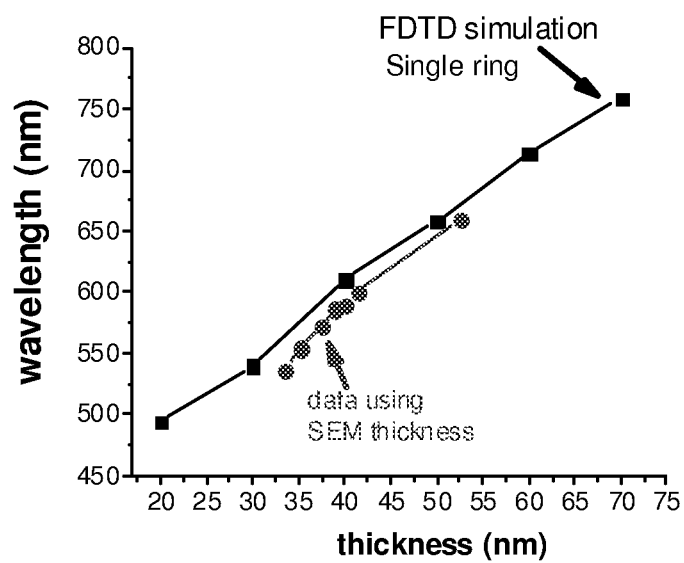
FIG. 1c is a plot of the measured and simulated wavelength of the spectral position of this resonance dip vs. film thickness, with the inset showing simulated spectra obtained from numerical calculations of the electromagnetic field profiles within such a nanostructure.

FIG. 1c shows a comparison of the wavelength of the resonant dip in the reflectance spectra between the data in FIG. 1b and a 3D electromagnetic simulation of the reflectivity. The inset in FIG. 1c shows the simulated spectra for circular, linear oval and open circular shapes of the gaps. All of them exhibit similar spectra and the positions of the dips agree with the experimental data. The simulation shows strong fields in those regions with a high degree of spatial confinement of the electromagnetic radiation. This behavior is characteristic of spoof and hybrid spoof plasmonic materials.

Figure 2A:
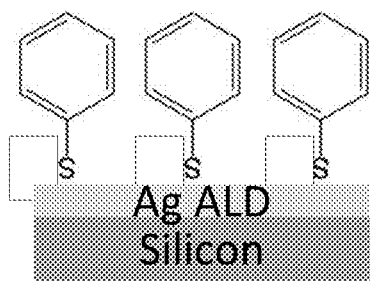
FIG. 2a shows a schematic of the benzene thiol molecule bound to the Ag-ALD substrate, in practice this could be replaced by one of a number of different molecules or by a surface-bound molecule to provide a specific chemical functionality that would interact directly with an analyte.
Figure 2B:
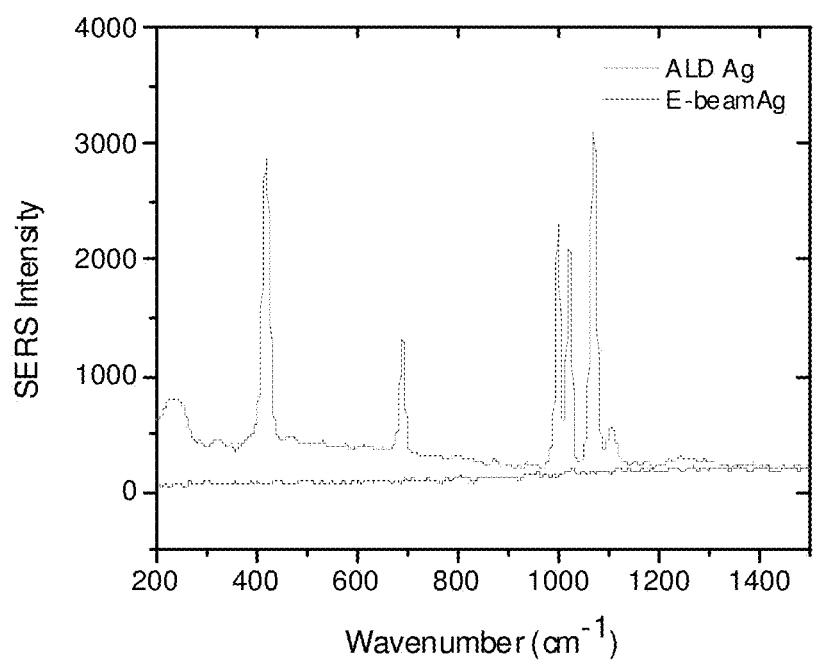
FIG. 2b provides a comparison of the SERS spectrum of benzene thiol using a PEALD Ag thin film (top line) and a comparably thick e-beam evaporated Ag film.
Figure 3A:
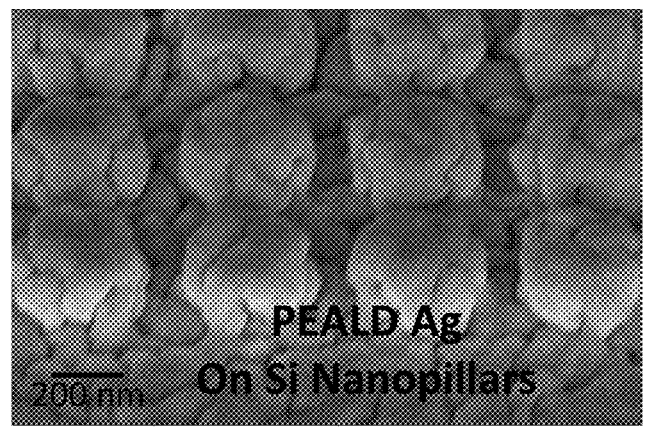
FIG. 3a presents an SEM image collected at 45° of PEALD Ag-coated Si nanopillars.
Figure 3B:
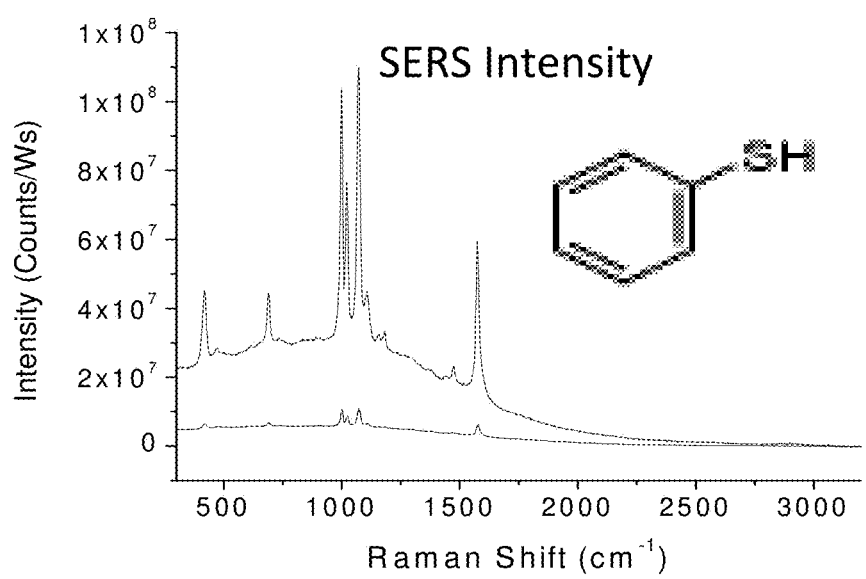
FIG. 3b depicts a comparison of the Raman spectrum from a neat (pure) solution of benzene thiol (bottom line) and the SERS spectrum collected from a PEALD Ag coated Si nanopillar array with a self-assembled monolayer of benzene thiol. Note that the signal from the nanopillar array is about an order of magnitude more intense, this despite sampling approximately $10^7$ less benzene thiol molecules, thereby leading to the reported >$10^8$ enhancement factors of the Raman scattering.
Figure 3C:
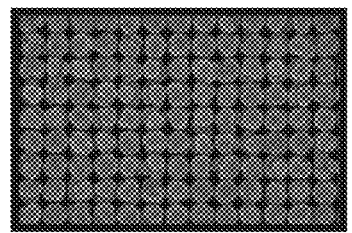
FIG. 3c and FIG. 3d present top-view SEM images of closely spaced (<2 nm edge-to-edge) and widely spaced (~100 nm edge-to-edge) Ag PEALD coated Si nanopillar arrays respectively. Note that the extremely tight separations achieved in FIG. 3c are enabled only by the PEALD process, whereby the atomic layer control of the metal deposition allows for the systematic reduction in the edge-to-edge separation between adjacent pillars until the desired separation is achieved.
Figure 3D:
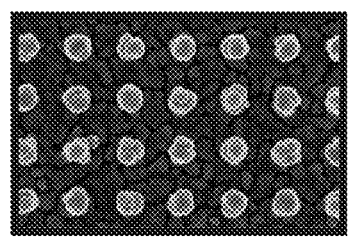
Figure 4A:
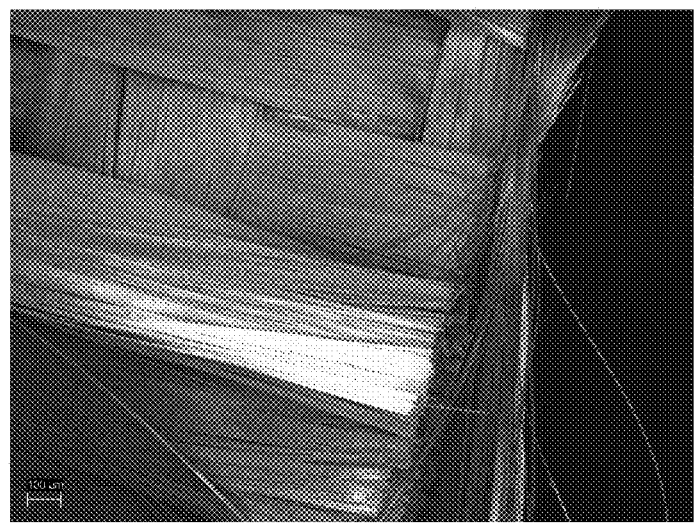
FIG. 4a shows an SEM image of a fabric coated with a conformal, 20 nm thick PEALD Ag film.
Figure 4B:
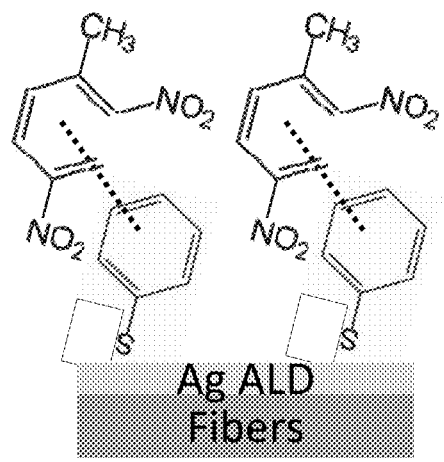
FIG. 4b provides a schematic of the orientation of the benzene thiol (BZT) and dinitrotoluene (DNT) molecules on the surface of the PEALD coated fibers.
Figure 4C:
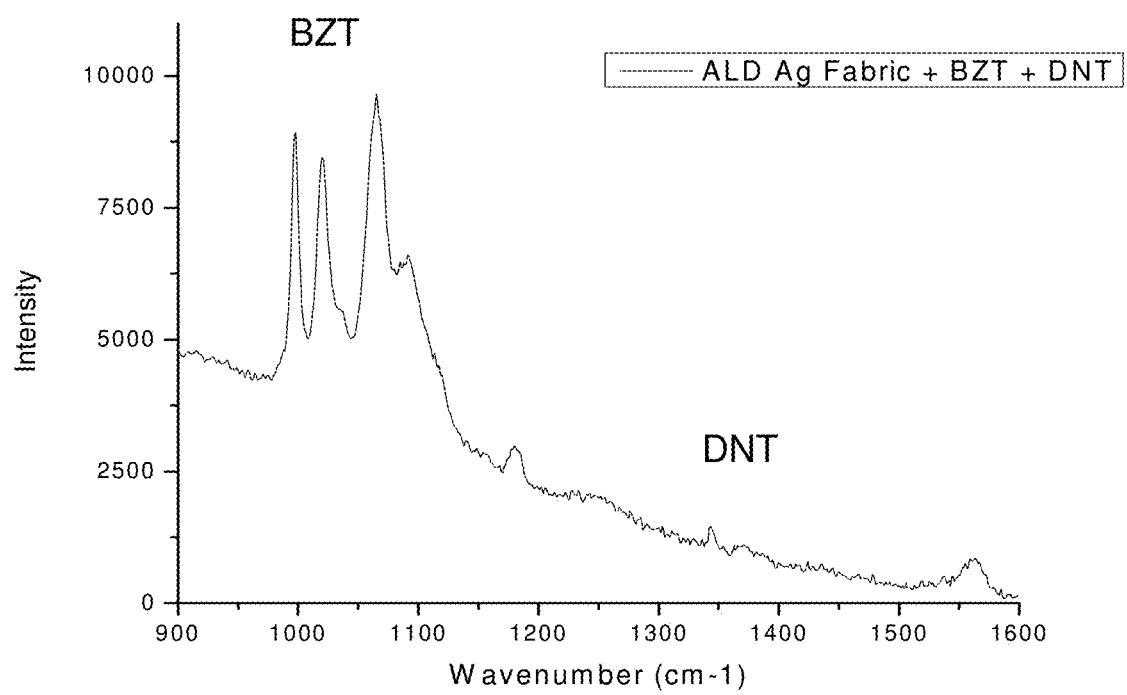
FIG. 4c provides the SERS spectrum of the BZT-TNT molecular layer on the Ag PEALD coated fibers.

The spoof-plasmon structure is an outcome of the slow nucleation time for metal-based ALD processes. Such mosaic tile like structures are observed for other metals with established ALD processes and those being developed and optimized, such as iridium, platinum, gold, copper, silver, etc. The present invention as described herein takes into account the use of this spoof-plasmon like behavior of these films for plasmonic and metamaterial operations and any such method where optical stimulation of localized or propagating electromagnetic fields within the materials are used for enhancing optical processes such as, but not limited to, luminescence, Raman scattering, fluorescence, non-linear optical processes (two photon absorption, up- or down-conversions of photon energies, sum-frequency generation, etc.), modifying thermal signatures, modifying the index of refraction of a metamaterial structure, etc. The use of such films for SERS experiments is demonstrated in FIG. 2a and FIG. 2b. These films can also be subsequently patterned or deposited onto a pre-patterned substrate to provide multi-resonant structures, coupled plasmonic resonance metamaterial structures to enhance multiple processes simultaneously, create a broad band emissive material, reflector, etc. An SEM image of such a deposition onto a prepatterned, Si nanopillar structure and the corresponding SERS response from a self-assembled monolayer of benzene thiol on that structure in comparison to the pure solution is presented in FIGS. 3a and b, respectively. Another potential method is the deposition of this material on highly porous 3D materials such as sol-gels, papers (carbon or otherwise), or porous semiconductors. Such a deposition on a fibrous paper, a schematic of the structure coated with a self-assembled monolayer of benzene thiol and dinitrotoluene is presented in FIGS. 4a, b and c, respectively. By doing so, one may create wipes for SERS sensors, high surface area vapor sensors among other devices.

Figure 5A:
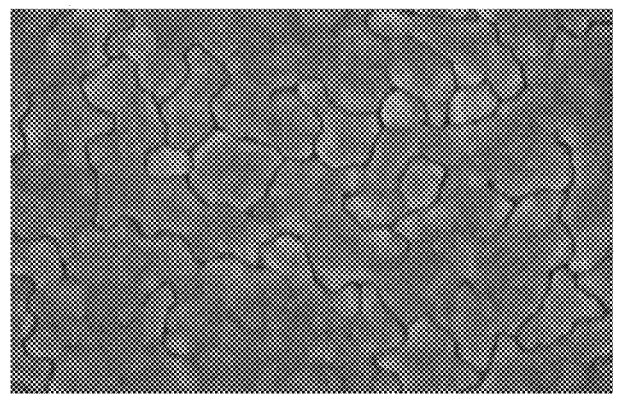
FIG. 5a shows an SEM image of a PEALD film of Ag demonstrating the naturally occurring mosaic nanostructures and gaps leading to the inherent spoof plasmonic metamaterial properties of these as-deposited films.
Figure 5B:
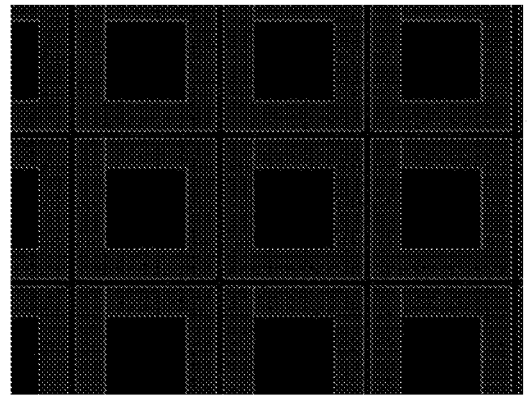
FIG. 5b depicts a CAD drawing of a designed spoof plasmonic structure that could be fabricated on a given substrate with the light regions consisting of the metal and the black regions being open holes, or vice-versa.
Figure 5C:
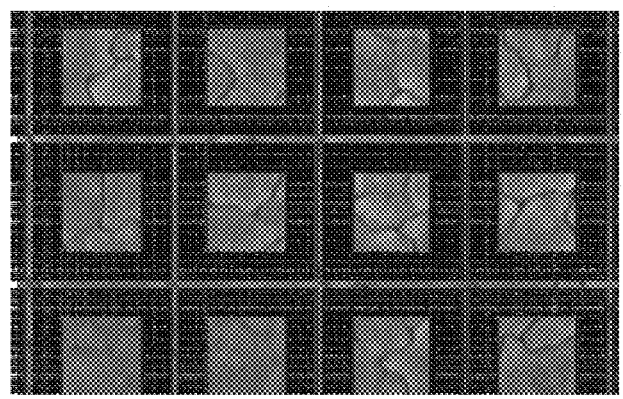
FIG. 5c depicts the hybrid spoof architecture created through the combination of the film in FIG. 5a and the structure in FIG. 5b. This could be created with fabricated structures similar in size to those that naturally occur within the PEALD films (as depicted in FIG. 5c) or with much larger fabricated structures depending on the spectral positions of the desired resonances. In the iteration depicted here, the darker regions could either be regions where the PEALD film was removed by etching or where a different metal was deposited and fabricated on top of the PEALD layer. This latter structure could either include or not include a dielectric spacer layer between the fabricated spoof structure and the PEALD film.

Multi-resonant metamaterial structures can be created by using the naturally occurring resonance of the spoof-plasmon nature of the PEALD films in combination with lithographically patterned spoof-plasmon structures within the same or disparate wavelength regimes. This can be realized in a number of forms, such as, but not limited to those depicted in FIG. 5c, in which case, the natural structure and corresponding optical resonance of the Ag PEALD film that is shown in FIG. 5a could be subsequently patterned using the spoof-plasmon design in FIG. 5b by using subtractive etching from the PEALD film in the pattern as shown. This pattern could of course be any active spoof-plasmon structure desired. Alternatively, a spoof plasmon structure could be fabricated into a different plasmonic material below or above the PEALD film. This could be separated from the PEALD film by a dielectric spacer layer to increase the plasmonic field intensities and/or to modify the coupling between the spoof plasmon structure and the spoof plasmons within the PEALD film. Such dual resonance structures could be useful for a wide-array of applications, for instance, enhancing two photon absorption, upconversion processes within rare earth species, enhancing/suppressing luminescence of different spectral bands within different crystals, dyes, etc.

In addition to those already discussed, there are many more potential applications of the present invention. The films can be used for chemical sensors and optical filters. They can also be used in biological applications with the film acting as an antibacterial layer. Another potential application is in the arts. The color of the films change with varying thicknesses, for example these PEALD silver films change colors dependent upon the position of the resonant dip and thus used as coatings for jewelry, decorative mosaics, containers such as urns and chalices, etc. with colors not typically associated with the metal of choice.

The above descriptions are those of the preferred embodiments of the invention. Various modifications and variations are possible in light of the above teachings without departing from the spirit and broader aspects of the invention. It is therefore to be understood that the claimed invention may be practiced otherwise than as specifically described. Any references to claim elements in the singular, for example, using the articles "a," "an," "the," or "said," is not to be construed as limiting the element to the singular.

What is claimed as new and desired to be protected by Letters Patent of the United States is:

1. A method of making a metamaterial thin film, comprising:
    depositing a metallic or metallic-like material using atomic layer deposition onto an arbitrary substrate to form a mosaic-like surface morphology comprising two dimensional nanostructure features resembling islands and comprising air gaps separating the two dimensional nanostructure features, wherein the air gap separation between the two dimensional nanostructure features is less than 4 nm;
    wherein a dielectric spacer layer and subsequently deposited spoof or hybrid-spoof plasmon film are deposited on top of the metallic or metallic-like material;

wherein after deposition of the spoof or hybrid-spoof plasmon film, the metallic or metallic-like material exhibits plasmonic and/or metamaterial properties.

* * * * *